United States Patent [19]

Stein

[11] Patent Number: 5,774,485

[45] Date of Patent: Jun. 30, 1998

[54] WAVELENGTH-TUNABLE LASER DEVICE

[75] Inventor: Karl-Ulrich Stein, Unterhaching, Germany

[73] Assignee: Siemens Aktiengesellschaft, Munich, Germany

[21] Appl. No.: 714,852

[22] Filed: Sep. 17, 1996

[30] Foreign Application Priority Data

Sep. 20, 1995 [DE] Germany ..................... 195 34 937.7

[51] Int. Cl.$^6$ ............................. H01S 3/10; H01S 3/13; H01S 3/00; H01S 3/19

[52] U.S. Cl. ............................ 372/20; 372/50; 372/26; 372/32; 372/33; 372/38

[58] Field of Search ............................. 372/20, 26, 32, 372/33, 38, 50, 96

[56] References Cited

U.S. PATENT DOCUMENTS

| | | | |
|---|---|---|---|
| 4,669,086 | 5/1987 | Kaede et al. | 372/32 |
| 5,313,482 | 5/1994 | Zelenka et al. | 372/38 |
| 5,347,529 | 9/1994 | Noe | 372/28 |

FOREIGN PATENT DOCUMENTS

| | | |
|---|---|---|
| 0 354 776 | 8/1989 | European Pat. Off. . |
| 0 333 494 | 9/1989 | European Pat. Off. . |
| 0 635 917 | 1/1995 | European Pat. Off. . |
| 0 635 917 A1 | 1/1995 | European Pat. Off. . |
| 42 31 177 A1 | 3/1994 | Germany . |
| 43 18 857 C1 | 7/1994 | Germany . |

OTHER PUBLICATIONS

Electronics Letters—4th January 1990, vol. 26, No. 1 Illek et al "over 7nm (875 GHz) Continuous Wavelength Tuning by Tunable Twin–guide (TTG) Laser Diode" pp. 46–47.

Wolf et al, "Continuously Tunable Metal–Clad Ridge–Waveguide Distributed Feedback Laser Diode" Electronic Letters, vol. 26 No. 22, pp. 1845–1846, Oct. 1990.

Electronics Letters 30th Jul. 1992 vol. 28, No. 16 pp. 1498–1499—"Analysis of Slots in Nonradiating dielectric Waveguide Using The Model Expansion Method" Lourtioz et al.

"Tunable Laser Diodes utilizing Transverse Tuning Scheme"—8217 Journal of Lightwave Technology 11(1993)Jul., No. 7, New York, US Amman et al pp. 1168–1182.

*Primary Examiner*—Rodney B. Bovernick
*Assistant Examiner*—Quyen Phan
*Attorney, Agent, or Firm*—Hill & Simpson

[57] ABSTRACT

A wavelength-tunable laser device has an active part comprising an active laser region for generating a laser emission with a predetermined emission wavelength, and a tuning part comprising a tuning region allocated to the active laser region and capable of tuning the emission wavelength of the laser light emitted by the active region. The active part is charged with a chronologically variable modulation current that controls the intensity of the emitted laser emission, and the tuning part is charged with an electrical tuning current for controlling the emission wavelength of the emitted laser light. The active part controls the intensity of the emitted laser light and the tuning part is charged with an electrical tuning current for controlling the emission wavelength of the emitted laser light. The tuning current that is supplied to the tuning part and controls the emission wavelength of the emitted laser light is directly derived from the chronologically variable modulation current. Further, the tuning current directly derived from the chronologically variable modulation current controls the tuning region acting on the active laser region such that the emission wavelength of the emitted laser light is kept independent of the intensity of the modulation current, and is kept essentially at least approximately to a constant value.

12 Claims, 2 Drawing Sheets

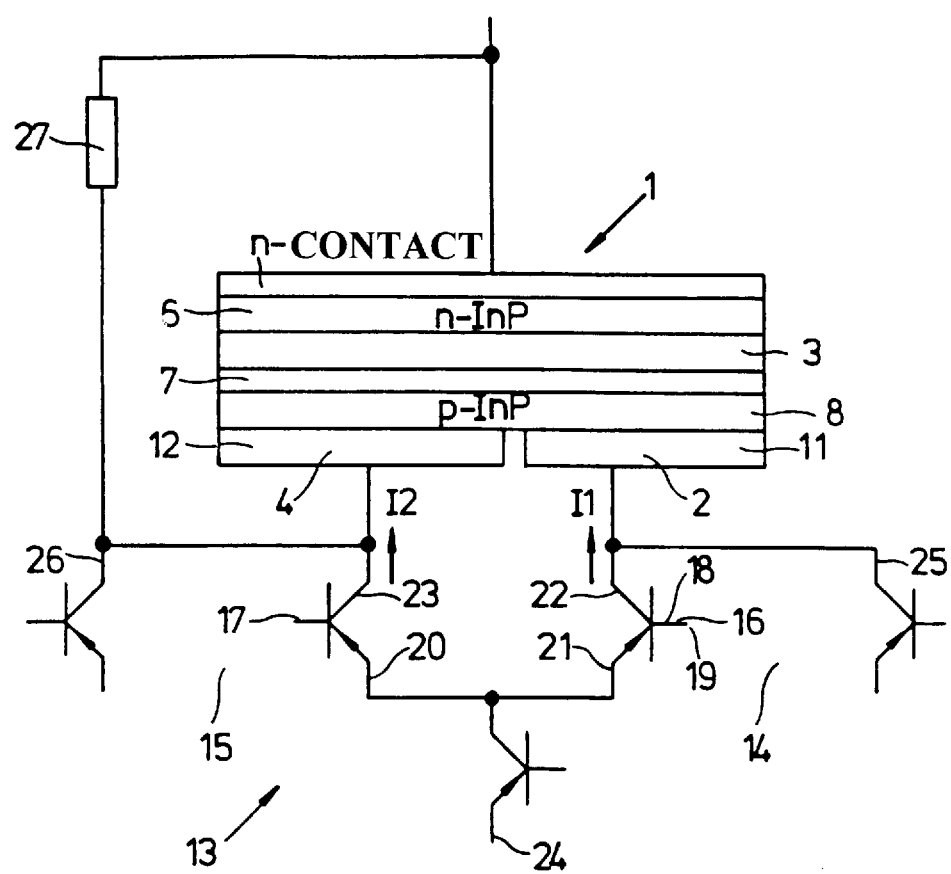

WAVELENGTH-TUNABLE LASER DEVICE

BACKGROUND OF THE INVENTION

The invention is directed to a wavelength-tunable laser device having an active part comprising an active laser region for generating a laser emission with a predetermined emission wavelength and having a tuning part comprising a tuning region allocated to the active laser region capable of tuning the emission wavelength of the laser emission emitted by the active region, whereby the active part is charged with a chronologically variable modulation current that controls the intensity of the emitted laser light, and the tuning part is charged with an electrical tuning current for controlling the emission wavelength of the emitted laser light.

Such a laser device is known, for example, from articles by M.-C. Amann, including those in Electronics Letters, Vol. 26, No. 1, 4 January 1990 pp.46 and 47 (Over 7 nm (875 Ghz) Continuous Wavelength Tuning by Tunable Twin-Guide (TTG) Laser Diode) and in Electronics Letters, Vol. 26, No. 22, 25 October 1990, pp. 1845 and 1846 (Continuously Tunable Metal-Clad Ridge-Waveguide Distributed Feedback Laser Diode). There the laser devices are known as a component part of transmission systems with light waveguides. What is disadvantageous about these transmission systems is the limitation of the range of the transmitted signal due to dispersion in the fiber and due to laser chirping, particularly in the region of the transmitted wavelengths around 1.55 $\mu$m in which the fiber amplifiers act. One of the causes of the undesirable range limitation lies in what is referred to as the adiabatic chirp of the employed laser due to the dependency of the wavelength of the emission emitted by the laser on the modulation current applied to the laser for controlling the intensity of the emitted laser light. Previous attempts have been made to compensate or to minimize the undesirable range limitation occurring due to the chip behavior of the laser, first via specific dispersion-compensating fibers that were attached at specific locations in the transmission path and, second, by employing specifically selected lasers that comprise a slight spectral bandwidth under modulation. Both of the techniques hitherto employed for compensating the effects on the range of an undesired frequency modulation due to chirp are complicated and correspondingly cost-unbeneficial. No particular techniques for eliminating these disadvantages were therefore undertaken in most applications; rather a limitation of the transmission range was accepted.

SUMMARY OF THE INVENTION

It is an object of the invention to make a wavelength-tunable laser device available as a transmitter for an optoelectronic transmission system that, given the least possible circuit-oriented expense, enables an at least approximately chirp-free transmission of optoelectronic data signals via light waveguides.

According to the invention, a wavelength-tunable laser device is provided having an active part and with an active laser region for generating a laser emission with a predetermined emission wavelength, and a tuning part having a tuning region allocated to the active laser region and capable of tuning the emission wavelength of the laser light emitted by the active region. The chronologically variable modulation current is provided for controlling intensity of the emitted laser emission connected to the active part. An electrical tuning current is provided for controlling the emission wavelength of the emitted laser light connected to the tuning part. The tuning current is directly derived from the chronologically variable modulation current.

It is provided according to the invention that the tuning current supplied to the tuning part and which controls the emission wavelength of the emitted laser light is derived from the chronologically variable modulation current. Adhering to the principle of the invention, it is provided that the tuning current directly derived from the chronologically variable modulation current controls the tuning region acting on the active laser region such that the emission wavelength of the emitted laser light is maintained independent of the intensity of the modulation current, and at least essentially approximately to a constant value.

According to the invention, the tunability is employed in order to compensate the undesired frequency modulation due to chirp. The adiabatic chirp of a laser is proportional to the applied modulation current, i.e. the frequency offset of the laser due to modulation of the active laser region is proportional to the applied current signal, so that the laser chirps. The frequency offset of the laser is likewise proportional to the current applied to the tuning region. When both laser regions are driven with a signal corresponding to the applied modulation current, and taking the corresponding proportionality constant into consideration, then the chirp parts of the two laser regions compensate one another.

In a particular preferred embodiment of the invention, it can be provided that a differential amplifier circuit having two circuit branches coupled to one another is provided, whereby the one circuit branch of the differential amplifier circuit is allocated to the active part and carries the chronologically variable modulation current for the direct modulation of the active laser region, and the second circuit branch of the differential amplifier circuit is allocated to the tuning part and supplies the tuning current derived directly from the modulation current. In an embodiment of the invention that is especially simple in terms of circuitry, it can be provided that the differential amplifier circuit comprises a first transistor allocated to the first circuit branch and a second transistor allocated to the second circuit branch, whereby a control signal corresponding to the chronologically variable modulation current is adjacent at the control or base terminal of the first transistor, and the one electrode or emitter terminal of the second transistor is coupled to the one electrode or emitter terminal of the first transistor, and the further electrode or collector terminal of the first transistor is allocated to the active part and the further electrode or collector terminal of the second transistor is allocated to the tuning part.

Further features, advantages and practicalities of the invention derive from the following description of preferred exemplary embodiments with reference to the drawings.

BRIEF DESCRIPTION OF THE DRAWINGS

FIG. 2 is a schematic view of a laser device with a two-section laser according to a second exemplary embodiment of the invention.

DESCRIPTION OF THE PREFERRED EMBODIMENTS

Figure 1:
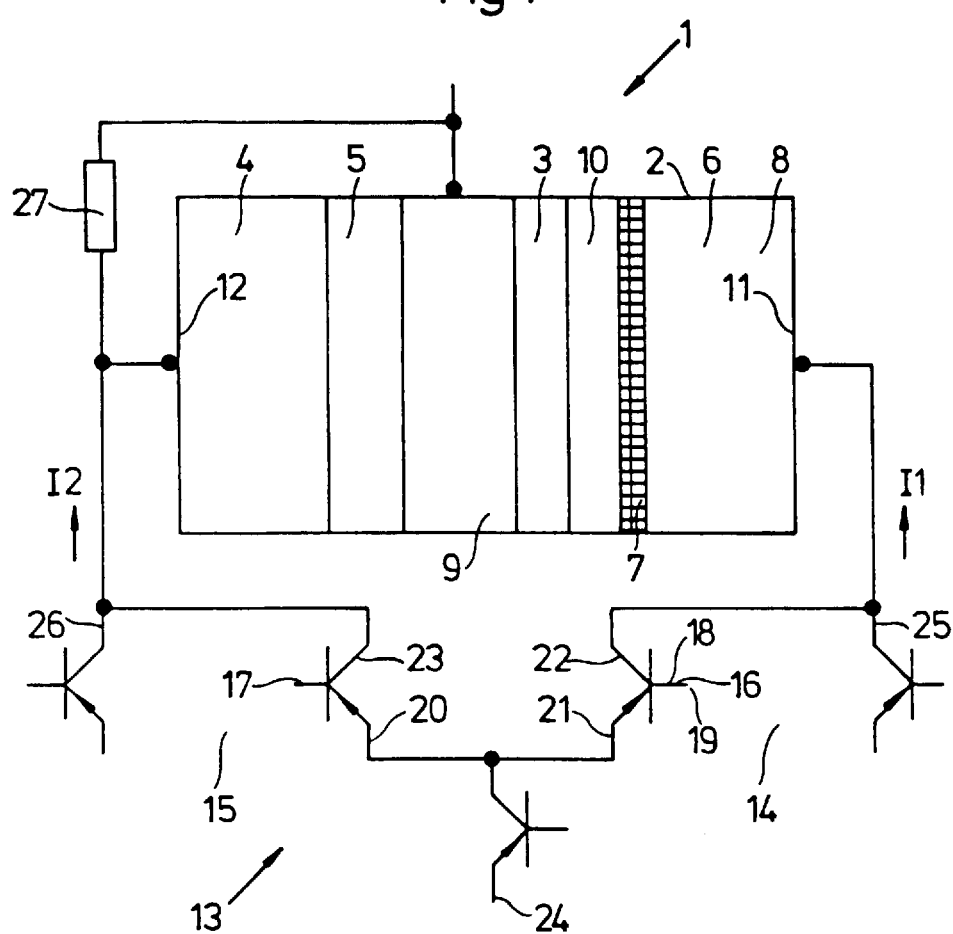
FIG. 1 is a schematic view of a laser device with a TTG (tunable twin guide) laser diode according to a first exemplary embodiment of the invention.

Given the exemplary embodiments shown in the drawing, a wavelength-tunable semiconductor laser diode 1 fabricated on a semiconductor substrate of InP comprises an active part 2 with an active laser region 3 for generating a laser emission with a predetermined emission wavelength, and comprises a tuning part 4 having a tuning region 5. The active laser region 3 having a typical layer thickness of approximately 0.1 μm is designed above a lattice layer 7 of the first order designed in a p-InGaAsP semiconductor layer 10 and having a typical grid constant of approximately 240 nm, the lattice or grid 7 being arranged on a p-doped InP buffer layer 8. The tuning region 5 having a typical layer thickness of approximately 0.3 μm is electronically decoupled from the active laser region 3 via an n-doped InP intermediate layer 9 that is typically approximately 0.1 μm thick. The two semiconductor regions 3 and 5 are thus designed (in a known way) such that the active laser region 3—after a chronologically variable modulation current has been applied, for example with a frequency of 10 GHz to an electrode 11—generates laser light with a predetermined emission wavelength, whereby the wavelength is variable within specific limits, for example up to approximately 7 nm, on the basis of a tuning current of, typically, approximately 20 mA that is supplied to the tuning region 5 via the electrode 12.

It is provided according to the invention that the tuning current I2 that is supplied to the tuning part and which controls the emission wavelength of the emitted laser light is directly derived from the chronologically variable modulation current I1 such that the tuning region 5 acting on the active laser region 3 controls the latter such that the emission wavelength of the emitted laser light is kept independent of the intensity of the modulation current I1 and is kept essentially at least approximately to a constant value. The tuning current I2 is thereby directly derived from the modulation current I1 such that the respective charge carrier densities in the two semiconductor regions 3 and 5 are controlled in complementary fashion relative to one another in the modulation, so that the resulting optical properties of the resonator volume do not change. In this way, the frequency modulation arising in the active laser region 3 dependent on the applied, chronologically variable modulation current I1 is compensated, so that the chirp effects of the laser device 1 are eliminated. In a preferred circuit-oriented realization according to FIGS. 1 and 2, a differential amplifier circuit 13 is provided for this purpose, this having two circuit branches 14 and 15 coupled to one another, whereby the one circuit branch 14 is allocated to the active part 2 and carries the chronologically variable modulation current for the direct modulation of the active laser region 3, and the second circuit branch 15 of the differential amplifier circuit 13 is allocated to the tuning part 4 and supplies the tuning current I2 derived directly from the modulation current I1. In the illustrated exemplary embodiments, the differential amplifier circuit 13 has a first transistor 16 allocated to the first circuit branch 14 and a second transistor 17 allocated to the second circuit branch 15. A control signal 19 corresponding to the chronologically variable modulation current I1 is adjacent at the control terminal 18 of the first transistor 16, whereby the emitter terminal 20 of the second transistor 17 is coupled to the emitter terminal 21 of the first transistor 16, and the collector terminal 22 of the first transistor 16 is allocated to the active part 2 and the collector terminal 23 of the second transistor 17 is allocated to the tuning part 4. A current source 24 is allocated to the differential amplifier circuit 13. In practice, a predetermined, constant modulation Townsend current 25 is supplied to the active laser region 3 and a predetermined, constant tuning Townsend current 26 is supplied to the tuning part 4. The modulation Townsend current or, respectively, the tuning Townsend current, can be set to a respectively constant value in the desired way independently of the modulation current I1 or tuning current I2, and independently of one another. It is critical to the invention that the tuning current I2 supplied to the tuning part 4 is directly derived from the chronologically variable modulation current I1. Particularly for the adaptation of different frequency dependencies of the active laser region 3 and of the tuning region 5, an equalizing element 27 can follow, this representing an attenuation element in the simplest case and, over and above this, potentially serving for level matching of the tuning current with, under certain circumstances,. an inversion of the operation sine of the current. Quite generally, the equalizer element indicated with reference numeral 27 and which is illustrated as an electrical resistor merely for the purposes of the referencing can comprise the passive and active wiring parallel to the transistor 16 or 17, or parallel to the TTG laser diode 1 in order to compensate static or dynamic differences of the current sensitivity of the two laser regions 3 and 5.

In the exemplary embodiment shown in FIG. 2, a TTG laser diode with an active region and a tuning region lying above one another has been replaced by a two-section laser diode 1 wherein the active laser region 3 and the compensating tuning region 5 lie in series with respect to the light propagation (longitudinal sectioning). As in the exemplary embodiment according to FIG. 1, the resonator of the laser diode 1 itself can be designed with a DFB, DBR or with a Fabry-Perot arrangement.

Although various minor changes and modifications might be proposed by those skilled in the art, it will be understood that I wish to include within the claims of the patent warranted hereon all such changes and modifications as reasonably come within my contribution to the art.

I claim as my invention:

1. A wavelength-tunable laser device, comprising:
an active part having an active laser region for generating a laser light emission with a predetermined emission wavelength;
a tuning part having a tuning region allocated to the active laser region and capable of tuning the emission wavelength of the laser light emitted by the active region;
a chronologically variable modulation current for controlling intensity of the emitted laser light emission connected to the active part;
an electrical tuning current for controlling the emission wavelength of the emitted laser light connected to the tuning part;
the tuning current being directly derived from the chronologically variable modulation current and
a differential amplifier circuit having a first circuit branch for supplying said tuning current and a second circuit branch for supplying said variable modulation current, the first and second circuit branches being commonly connected at one end to a current source so that the variations in the modulation current also appear in the tuning current but in opposite phase so that resulting optical properties of resonator volume do not change and frequency modulation arising in the active laser region dependent on the variable modulation current is compensated.

2. A laser device according to claim 1 wherein the tuning current derived directly from the chronologically variable modulation current controls the tuning region acting on the active laser region such that the emission wavelength of the emitted laser light is kept independent of the intensity of the modulation current and is kept essentially at least approximately at a constant value.

3. A laser device according to claim 1 wherein the differential amplifier circuit is preceded by a current source.

4. A laser device according to claim 1 wherein the active part is connected to a predetermined, constant modulation Townsend current and the tuning part is connected to a predetermined, constant tuning Townsend current.

5. A laser device according to claim 4 wherein the constant modulation Townsend current is separately supplied to the active part and the constant tuning Townsend current is separately supplied to the tuning part.

6. A laser device according to claim 1 wherein the tuning part is preceded by an equalizing element.

7. A laser device according to claim 1 wherein the active laser region of the active part and the tuning region of the tuning part are arranged in series with one another with respect to a propagation direction of the emitted laser light.

8. A laser device according to claim 1 wherein the laser device is a semiconductor laser diode having a DFB arrangement.

9. A laser device according to claim 1 wherein the laser device is a semiconductor laser diode having a DBR arrangement.

10. A laser device according to claim 1 wherein the laser device is a semiconductor laser diode having a Fabry-Perot arrangement.

11. A wavelength-tunable laser device, comprising:

an active part having an active laser region for generating a laser light emission with a predetermined emission wavelength;

a tuning part having a tuning region allocated to the active laser region and capable of tuning the emission wavelength of the laser light emitted by the active region;

a chronologically variable modulation current for controlling intensity of the emitted laser light emission connected to the active part;

an electrical tuning current for controlling the emission wavelength of the emitted laser light connected to the tuning part;

the tuning current being directly derived from the chronologically variable modulation current;

a differential amplifier circuit with two circuit branches coupled to one another, the one circuit branch of the differential amplifier circuit being allocated to the active part and carrying the chronologically variable modulation current for the direct modulation of the active laser region, and the second circuit branch of the differential amplifier circuit being allocated to the tuning part and supplying the tuning current derived directly from the modulation current; and the differential amplifier circuit comprising a first transistor allocated to the first circuit branch and a second transistor allocated to the second circuit branch, a control signal corresponding to the chronologically variable modulation current being provided at the control ternminal of the first transistor, one electrode terminal of the second transistor being coupled to one electrode terminal of the first transistor, and a further electrode terminal of the first transistor being allocated to the active part and a further electrode terminal of the second transistor being allocated to the tuning part.

12. A wavelength-tunable laser device, comprising:

an active part having an active laser region for generating a laser light emission with a predetermined emission wavelength;

a tuning part having a tuning region associated with the active laser region and for tuning the emission wavelength of the laser light emitted by the active region;

a variable modulation current for controlling intensity of the emitted laser light emission connected to the active part;

an electrical tuning current connected to the tuning part for controlling the emission wavelength of the emitted laser light;

the tuning current being derived from the variable modulation current; and a differential amplifier circuit having a first circuit branch for supplying said tuning current and a second circuit branch for supplying said variable modulation current, the first and second circuit branches being commonly connected at one end to a current source so that the variations in the modulation current also appear in the tuning current but in opposite phase so that resulting optical properties of resonator volume do not change and frequency modulation arising in the active laser region dependent on the variable modulation current is compensated.

* * * * *